(12) United States Patent
Kovitsophon et al.

(10) Patent No.: US 11,887,864 B2
(45) Date of Patent: Jan. 30, 2024

(54) METHOD OF FORMING A SURFACE-MOUNT INTEGRATED CIRCUIT PACKAGE WITH SOLDER ENHANCED LEADFRAME TERMINALS

(71) Applicant: Microchip Technology Incorporated, Chandler, AZ (US)

(72) Inventors: Wichai Kovitsophon, A. Muang chacherngsao (TH); Rangsun Kitnarong, Nonthaburi (TH); Ekgachai Kenganantanon, Bangkok (TH); Pattarapon Poolsup, Bangkok (TH); Watcharapong Nokde, Chachoengsao (TH); Chanyuth Junjuewong, Chachoengsao (TH)

(73) Assignee: Microchip Technology Incorporated, Chandler, AZ (US)

( * ) Notice: Subject to any disclaimer, the term of this patent is extended or adjusted under 35 U.S.C. 154(b) by 250 days.

(21) Appl. No.: 17/326,488

(22) Filed: May 21, 2021

(65) Prior Publication Data
US 2022/0344173 A1 Oct. 27, 2022

Related U.S. Application Data

(60) Provisional application No. 63/179,712, filed on Apr. 26, 2021.

(51) Int. Cl.
*H01L 21/56* (2006.01)
*H01L 21/78* (2006.01)
(Continued)

(52) U.S. Cl.
CPC .......... *H01L 21/56* (2013.01); *H01L 21/4839* (2013.01); *H01L 21/78* (2013.01); *H01L 23/544* (2013.01); *H01L 2021/60007* (2013.01)

(58) Field of Classification Search
CPC . H01L 23/49861; H01L 23/495–49596; H01L 21/56–568; H01L 2924/181–186;
(Continued)

(56) References Cited

U.S. PATENT DOCUMENTS 7,023,074 B2 * 4/2006 Li .................. H01L 23/3107
257/730
2015/0084172 A1 3/2015 Do et al. ................. 257/676
(Continued)

FOREIGN PATENT DOCUMENTS

WO 2017/177080 A1 10/2017 ............. H01L 21/48

OTHER PUBLICATIONS

International Search Report and Written Opinion, Application No. PCT/US2021/055728, 12 pages, dated Feb. 7, 2022.

*Primary Examiner* — Julio J Maldonado
*Assistant Examiner* — Stanetta D Isaac
(74) *Attorney, Agent, or Firm* — SLAYDEN GRUBERT BEARD PLLC

(57) ABSTRACT

Flat no-leads integrated circuit (IC) packages are formed with solder wettable leadframe terminals. Dies are mounted on die attach pads, bonded to adjacent leadframe terminal structures, and encapsulated in a mold compound. A laser grooving process removes mold compound from a leadframe terminal groove extending along a row of leadframe terminal structures. A saw step cut along the leadframe terminal groove extends partially through the leadframe thickness to define a saw step cut groove. Exposed leadframe surfaces, including surfaces exposed by the saw step cut, are plated with a solder-enhancing material. A singulation cut is performed along the saw step cut groove to define leadframe terminals with end surfaces plated with the solder-enhancing material. The laser grooving process may improve the results of the saw step cut, and the saw step cut
(Continued)

may remove mold compound not removed by the laser grooving process.

21 Claims, 9 Drawing Sheets

(51) Int. Cl.
*H01L 23/544* (2006.01)
*H01L 21/48* (2006.01)
*H01L 21/60* (2006.01)

(58) Field of Classification Search
CPC .. H01L 23/562–576; H01L 21/78–786; B28D 5/0052; B28D 5/00–0047
See application file for complete search history.

(56) References Cited

U.S. PATENT DOCUMENTS

| | | | |
|---|---|---|---|
| 2016/0148877 A1 | 5/2016 | Kitnarong et al. | 257/666 |
| 2017/0133302 A1* | 5/2017 | Truhitte | H01L 23/49548 |
| 2017/0271246 A1* | 9/2017 | Macheiner | H01L 21/4828 |
| 2017/0294367 A1* | 10/2017 | Kitnarong | H01L 22/14 |
| 2018/0122731 A1* | 5/2018 | Komatsu | H01L 21/561 |
| 2020/0211935 A1 | 7/2020 | Kitnarong et al. | |

* cited by examiner

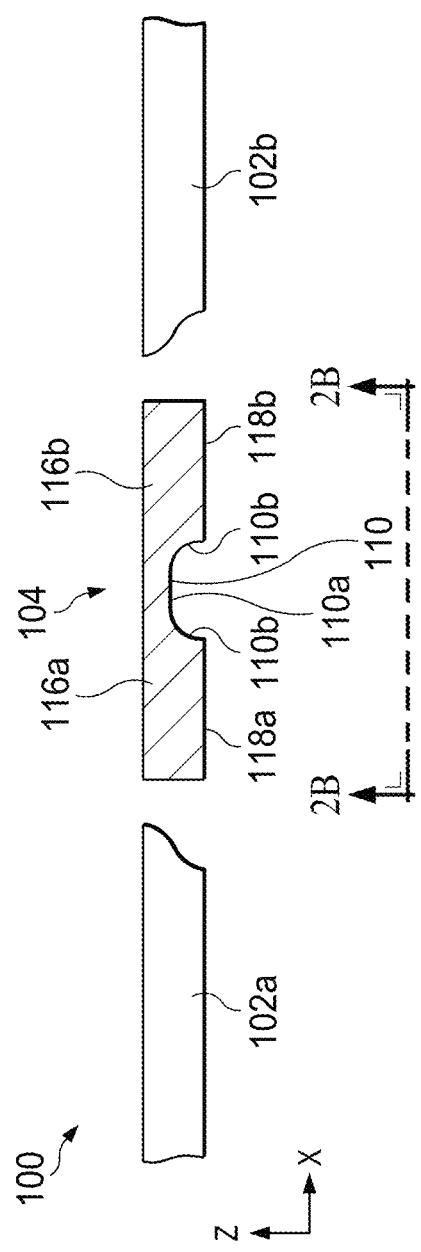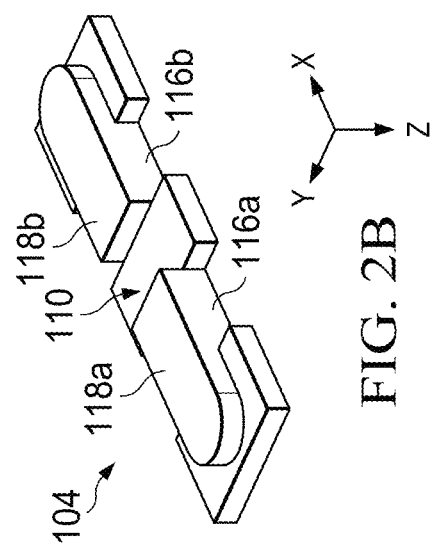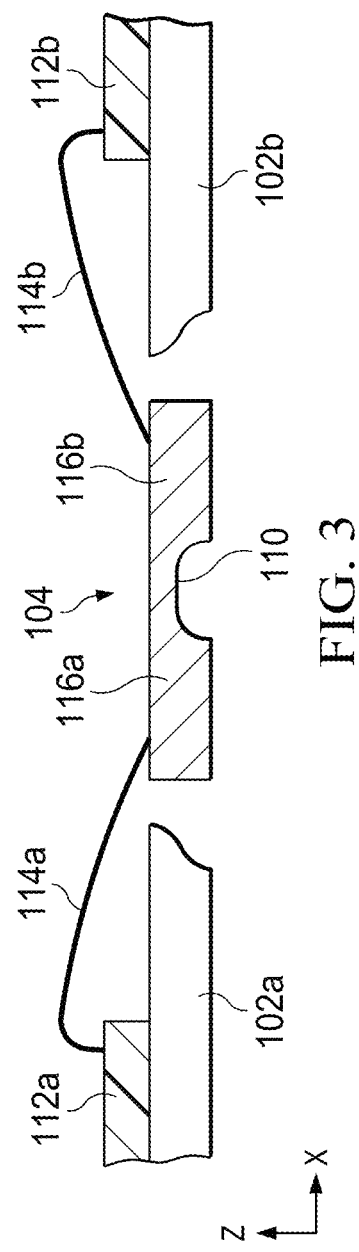

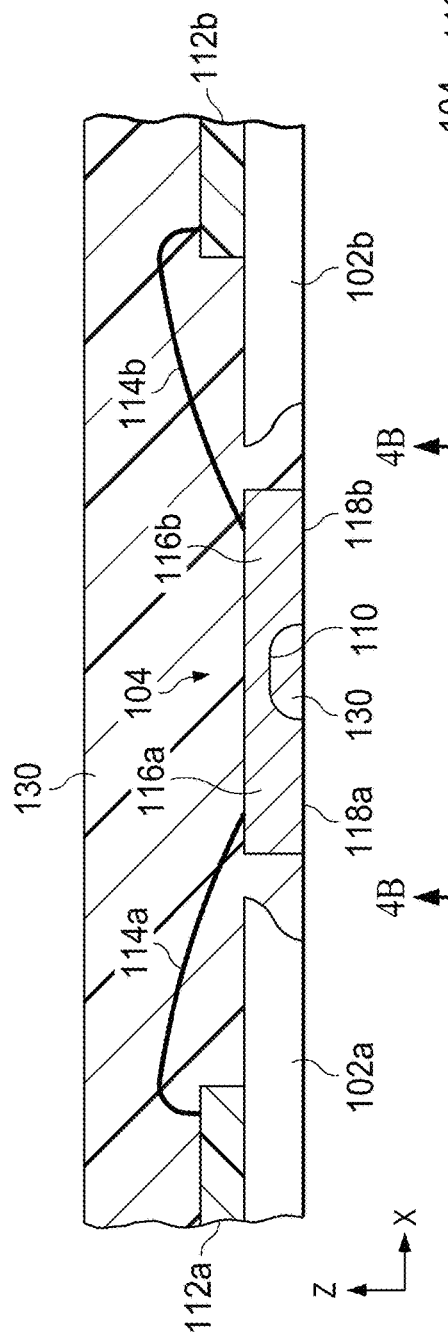
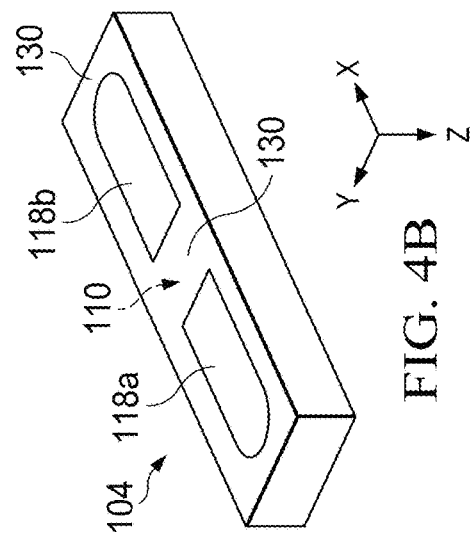
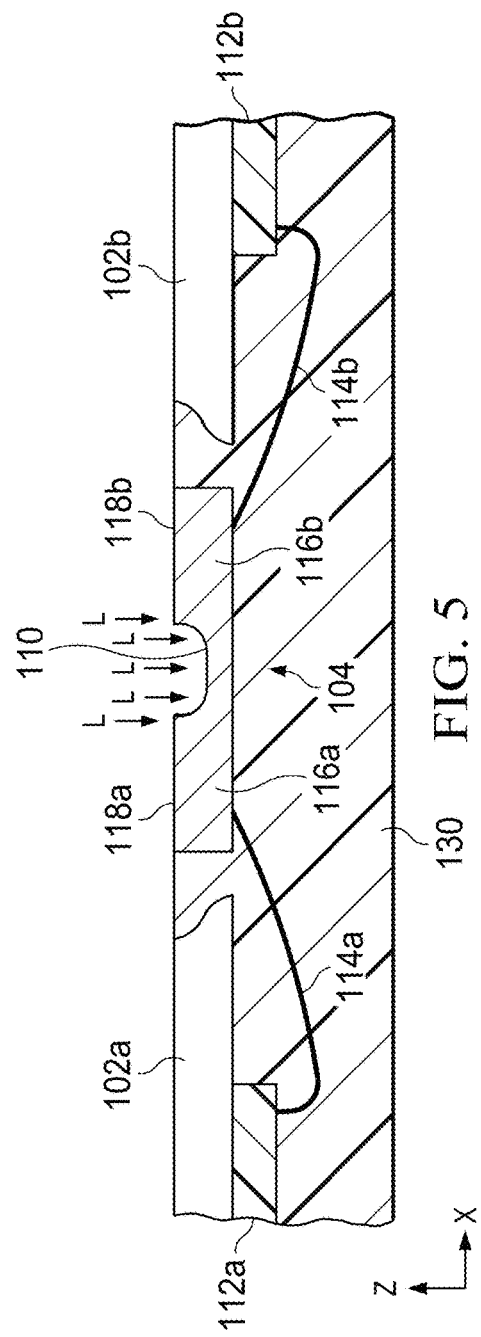
FIG. 4A
FIG. 4B
FIG. 5

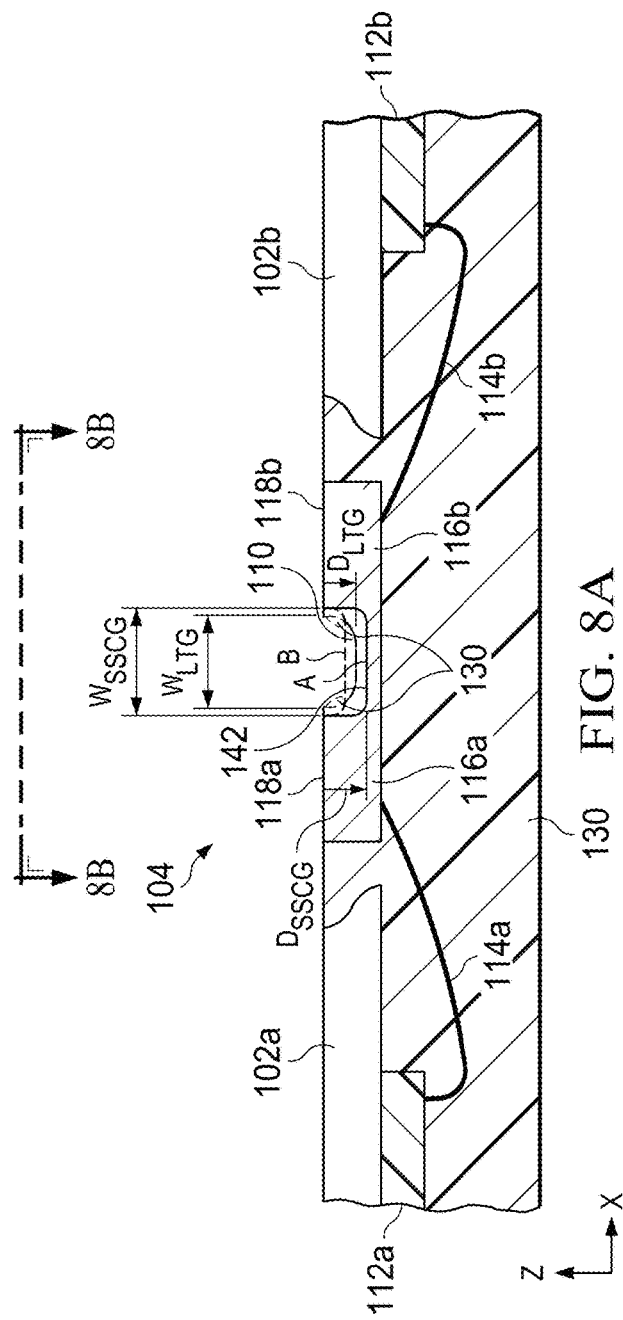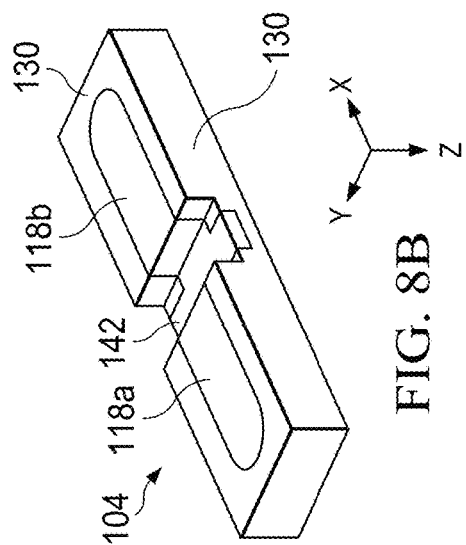
FIG. 8A
FIG. 8B

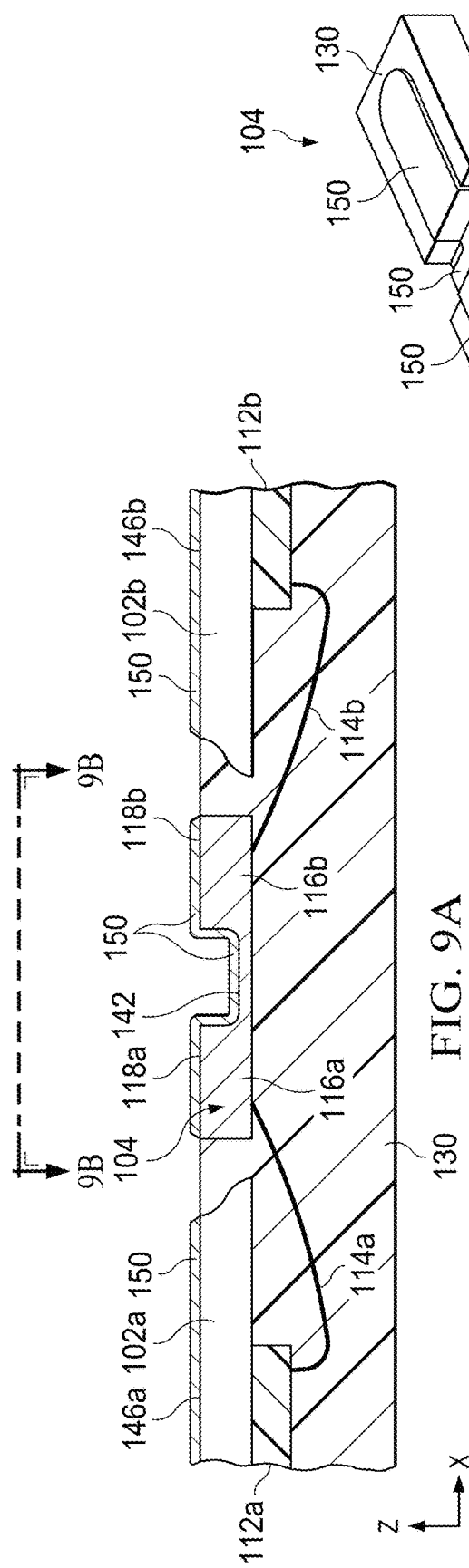
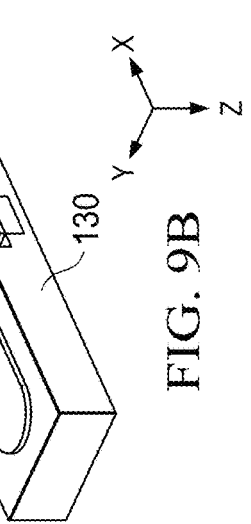
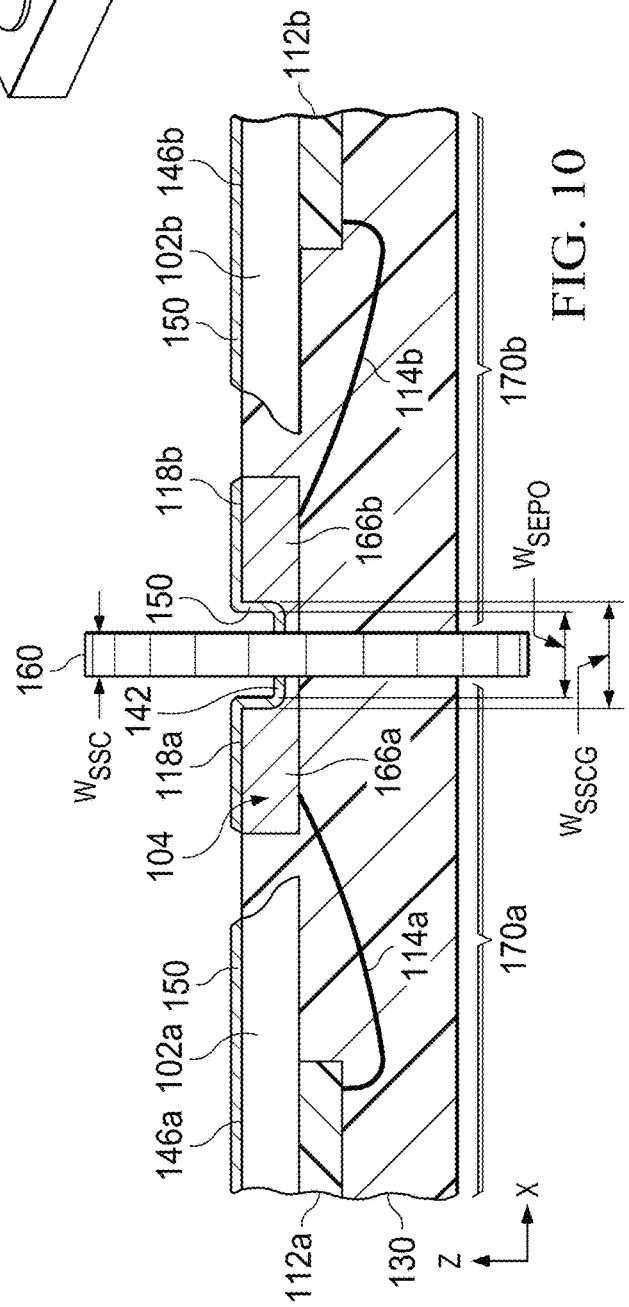
FIG. 9A
FIG. 9B
FIG. 10

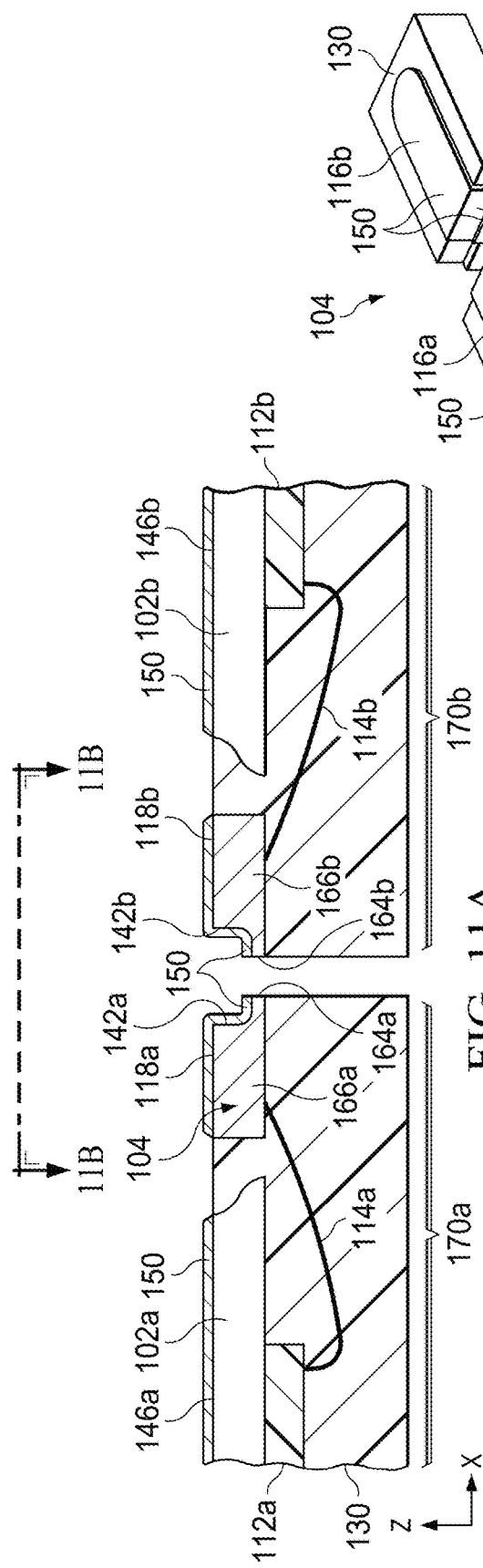
FIG. 11A
FIG. 11B
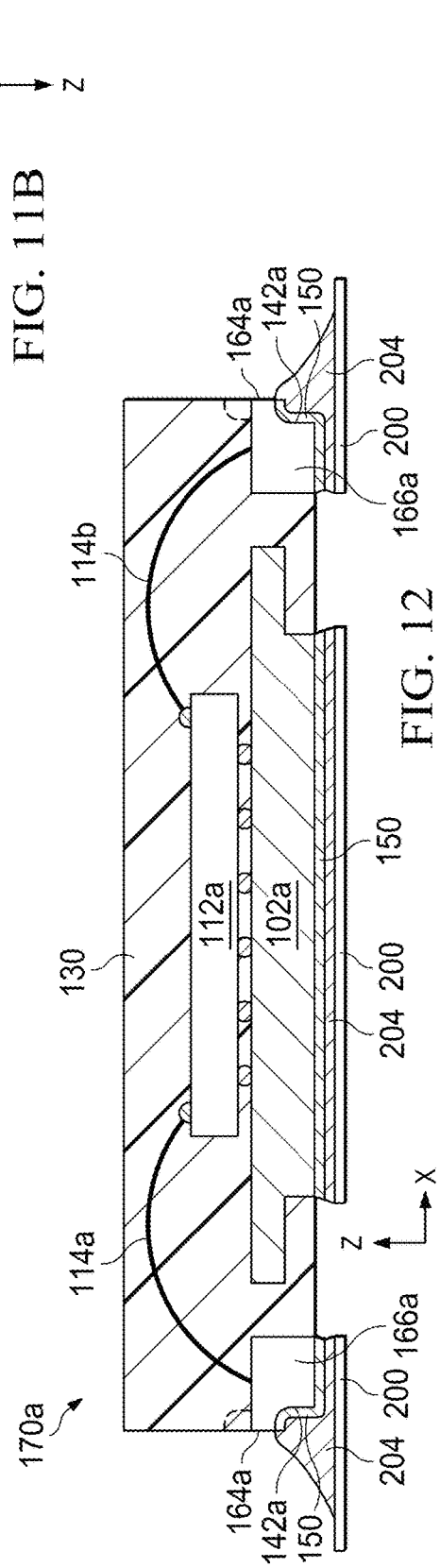
FIG. 12

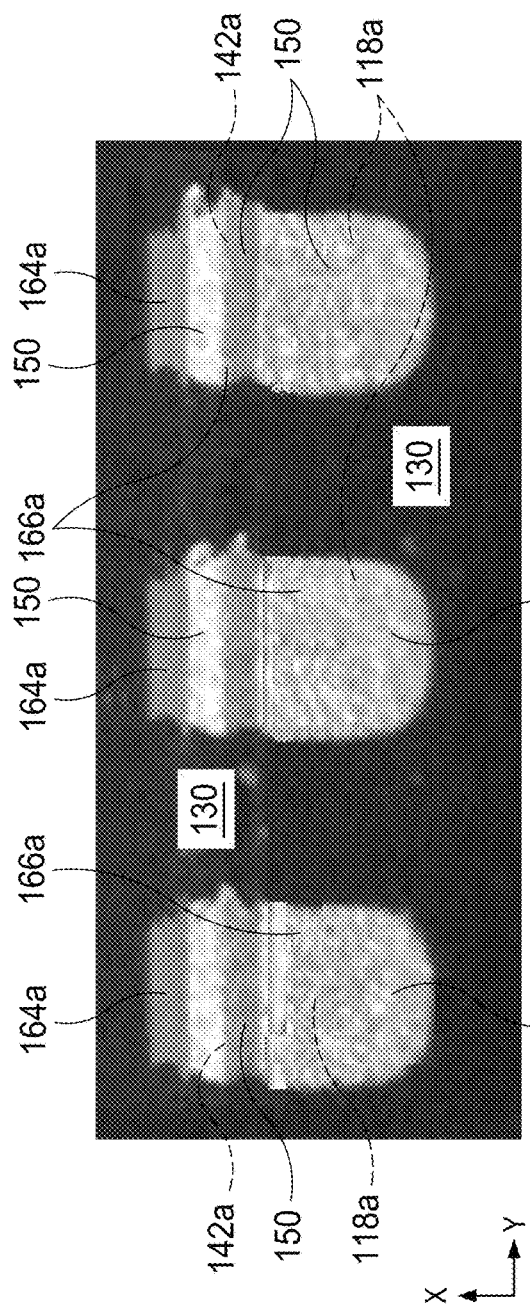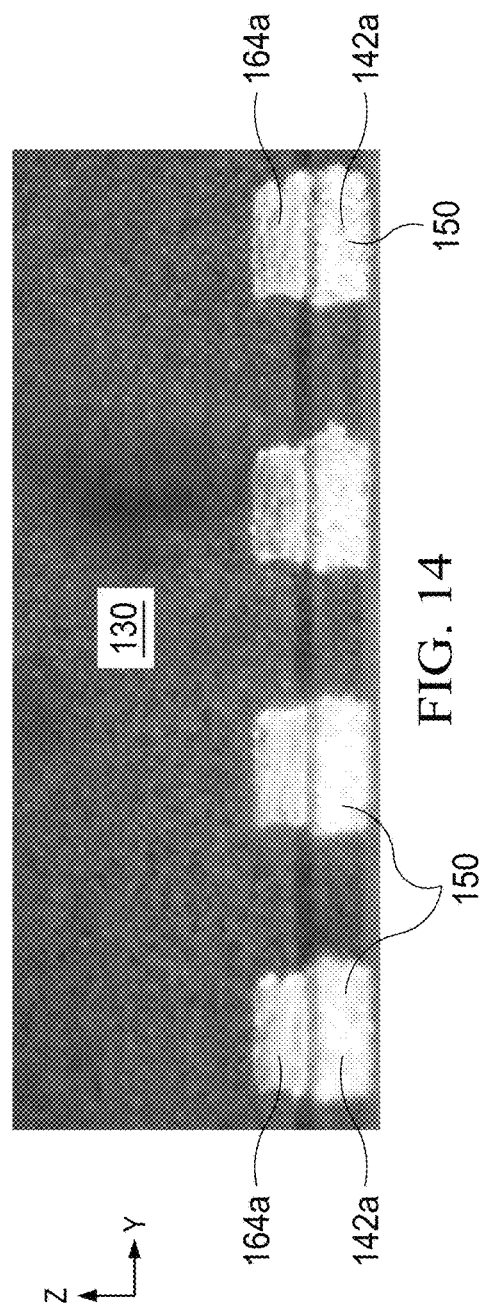

METHOD OF FORMING A SURFACE-MOUNT INTEGRATED CIRCUIT PACKAGE WITH SOLDER ENHANCED LEADFRAME TERMINALS

RELATED APPLICATION

This application claims priority to commonly owned U.S. Provisional Patent Application No. 63/179,712 filed Apr. 26, 2021, the entire contents of which are hereby incorporated by reference for all purposes.

TECHNICAL FIELD

The present disclosure relates to surface-mount integrated circuit (IC) packages, e.g., methods of forming surface-mounted IC packages with solder enhanced leadframe terminals, e.g., using a process including both a laser grooving and a saw step cut prior to a singulation cut.

BACKGROUND

Two types of surface-mount packages for connecting an integrated circuit device (e.g., die or chip) to a printed circuit board (PCB) are (1) packages having a number of leads extending out from the sides of the package, commonly referred to as "flat leads packages," and (2) flat packages having no leads extending out from the sides of the package, commonly referred to herein as "flat no-leads packages."

A flat no-leads packages, for example quad-flat no-leads (QFN) and dual-flat no-leads (DFN) may be secured to a PCB by a surface-mount solder connection to the PCB without using package leads and or through-holes in the PCB. For example, a flat no-leads package may include a die mounted on a leadframe (e.g., a copper leadframe) and encapsulated in an insulating mold compound. The leadframe may include a die attach pad and a number of leadframe terminals located around the die attach pad. The die may be mounted on the die attached pad and connected to each leadframe terminal by a wire bond. Each leadframe terminal of the QFN, or DFN, package can be solder mounted to an underlying PCB pad, to provide a physical and electrical connections between the QFN, or DFN, package and the PCB.

In some flat no-leads packages, the leadframe terminals may be at least partially plated with a solder-enhancing material to improve the solder bond between each leadframe terminal and an underlying PCB. In other words, the solder-enhancing material may improve the "solder wettability" of the leadframe terminals. However, some techniques for forming packages having plated leadframe terminals may result in the formation of burrs from the leadframe material (e.g., copper burrs), which may cause electrical shorting (or "bridging") between adjacent leadframe terminals. In addition, some techniques may fail to effectively remove mold compound from leadframe terminal surfaces to be plated with the solder-enhancing material, which may reduce the effectiveness of the solder-enhancing plating, or in other words reduce the solder wettability of the leadframe terminals.

There is a need for improved processes for forming packages having leadframe terminals plated with solder-enhancing material, e.g., to avoid or lessen the problems discussed above.

SUMMARY

The present disclosure provides methods of forming flat no-leads integrated circuit (IC) packages having solder wettable leadframe terminals, i.e., leadframe terminals plated with a solder-enhancing material to improve a solder connection with a PCB. IC dies (chips) are mounted on die attach pads, bonded to adjacent leadframe terminal structures, and encapsulated in a mold compound. A laser grooving process and chemical deflash may be performed to remove at least a portion of mold compound from a leadframe terminal groove that extends along a row of leadframe terminal structures. A saw step cut may be performed along the leadframe terminal groove and extending partially through the leadframe thickness to define a saw step cut groove. The saw step cut, which may be wider than the leadframe terminal groove, may remove any mold compound remaining in the leadframe terminal groove after the laser grooving process and chemical deflash. Exposed leadframe surfaces, including terminal end surfaces exposed by the saw step cut, are plated with a solder-enhancing material, e.g., tin. A singulation cut may be performed along the saw step cut groove, with a narrower width then the saw step cut groove, to define leadframe terminals with terminal end surfaces plated with the solder-enhancing material. The singulated package may be solder mounted to the PCB, wherein the solder-enhancing plating of the leadframe terminal end surfaces may provide an enhanced solder connection.

The laser grooving process performed prior to the saw step cut may improve the results of the saw step cut. For example, the laser grooving process may remove a substantial amount of mold compound from the leadframe terminal groove, which may reduce the formation of metal burrs from the leadframe resulting from the saw step cut, for example caused by silica in the mold compound deforming the softer material (e.g., copper) of the leadframe.

In addition, performing the saw step cut that removes any mold compound remaining in the leadframe terminal groove after the laser grooving process and chemical deflash may improve the solder-enhancing plating (e.g., tin plating) of the leadframe terminal end surfaces, which may improve the solder connection between the leadframe terminal and the PCB.

One aspect provides a method of forming an electronic device. An encapsulated integrated circuit (IC) structure is formed or accessed, which includes a first die mounted on a first die attach pad, a second die mounted on a second die attach pad, and a row of leadframe terminal structures between the first and second die attach pads, and a mold compound encapsulating the first and second dies and at least partially filling a leadframe terminal groove extending along the row of leadframe terminal structures. A laser grooving process is performed to remove a first amount of the mold compound from the leadframe terminal groove extending along the row of leadframe terminal structures. A saw step cut is performed along the leadframe terminal groove and extending through a partial depth of each leadframe terminal structure to define a saw step cut groove, the saw step cut groove having a lateral width larger than a lateral width of the leadframe terminal groove. A plating process is performed to plate exposed surfaces of each leadframe terminal structure, including exposed surfaces of the saw step cut groove, with a solder-enhancing plating material. A singulation process is performed to define a first IC package including the first die and a second IC package including the second die. The singulation process includes a singulation cut extending along the row of leadframe terminal structures and aligned with the saw step cut groove. The singulation cut divides each leadframe terminal structure into (a) a first leadframe terminal of the first IC package, the first leadframe terminal having a first terminal end surface and (b) a second leadframe terminal of the second IC package, the second leadframe terminal having a second terminal end surface. The singulation cut has a lateral width smaller than the lateral width of the saw step cut groove such that a region of solder-enhancing plating material remains on each of the first terminal end surface and second first terminal end surface defined by the singulation cut.

In one example, after the singulation process, the first IC package is mounted to a printed circuit board (PCB) by a process including soldering the first leadframe terminal to the PCB, wherein the region of solder-enhancing plating material on each first leadframe terminal provides an enhanced solder connection between the first IC package and the PCB.

In one example, a chemical deflash is performed after the laser grooving process and before the saw step cut to remove a second amount of the mold compound remaining in the leadframe terminal groove after the laser grooving process.

In one example, a remaining region of the mold compound remains in the leadframe terminal groove after the laser grooving process, and the saw step cut removes the remaining region of mold compound from the leadframe terminal groove.

In one example, the leadframe terminal groove has a bottom region and sidewall regions extending from opposing sides of the bottom region, a remaining region of the mold compound remains on at least one of the sidewall regions of the leadframe terminal groove after the laser grooving process, and the saw step cut removes the remaining region of mold compound from the sidewall surface of the leadframe terminal groove.

In one example, the saw step cut extends down to a vertical depth below the leadframe terminal groove. In another example, the saw step cut extends down to a depth above the bottom of the leadframe terminal groove.

In one example, the solder-enhancing plating material comprises tin.

In one example, the plating process comprise an electroplating process.

In some examples, the first IC package comprises a flat no-leads package. For example, the first IC package may comprise a quad-flat no-leads (QFN) package, a dual-flat no-leads (DFN) package, or a micro lead frame (MLP) package.

Another aspect provides a method of forming an electronic device. A first die and a second are mounted to a first die attach pad and second die attach pad, respectively, of a leadframe. Each of the first and second dies are bonded to a row of leadframe terminal structures of the leadframe between the first and second die attach pads. The first and second bonded dies are encapsulated with a mold compound that at least partially fills a leadframe terminal groove extending along the row of leadframe terminal structures between the first and second die attach pads. A laser grooving process is performed along the leadframe terminal groove to remove a first amount of the mold compound from the leadframe terminal groove. A saw step cut is performed along the leadframe terminal groove and extending through a partial depth of each leadframe terminal structure to define a saw step cut groove, the saw step cut groove having a lateral width larger than a lateral width of the leadframe terminal groove. A plating process is performed to plate exposed surfaces of each leadframe terminal structure including exposed surfaces of the saw step cut groove, with a solder-enhancing plating material. A singulation process is performed to define a first IC package including the first die and a second IC package including the second die, the singulation process including a singulation cut extending along the row of leadframe terminal structures and aligned with the saw step cut groove. The singulation cut divides each leadframe terminal structure into (a) a first leadframe terminal of the first IC package, the first leadframe terminal having a first terminal end surface and (b) a second leadframe terminal of the second IC package, the second leadframe terminal having a second terminal end surface. The singulation cut has a lateral width smaller than the lateral width of the saw step cut groove such that a region of solder-enhancing plating material remains on each of the first terminal end surface and second first terminal end surface defined by the singulation cut.

In one example, after the singulation process, the first IC package is mounted to a printed circuit board (PCB), including soldering the first leadframe terminal to the PCB, wherein the region of solder-enhancing plating material on each first leadframe terminal provides an enhanced solder connection between the first IC package and the PCB.

In one example, a chemical deflash is performed after the laser grooving process and before the saw step cut to chemically remove a second amount of the mold compound remaining in the leadframe terminal groove after the laser grooving process.

In one example, the leadframe including the first and second die attach pads and the row of leadframe terminal structures is formed by half etching a leadframe blank.

In one example, a remaining region of the mold compound remains in the leadframe terminal groove after the laser grooving process, and the saw step cut removes the remaining region of mold compound from the leadframe terminal groove.

In one example, the leadframe terminal groove has a bottom region and sidewall regions extending from opposing sides of the bottom region, a remaining region of the mold compound remains on at least one of the sidewall regions of the leadframe terminal groove after the laser grooving process, and the saw step cut removes the remaining region of mold compound from the sidewall surface of the leadframe terminal groove.

In one example, the saw step cut extends down to a vertical depth below the leadframe terminal groove. In another example, the saw step cut extends down to a depth above the bottom of the leadframe terminal groove.

BRIEF DESCRIPTION OF THE DRAWINGS

Example aspects of the present disclosure are described below in conjunction with the figures, in which:

FIGS. 1-11B show an example process for forming flat no-leads packages having leadframe terminals plated with solder-enhancing material;

FIG. 12 shows a side cross-sectional view of an example no-leads package mounted to a PCB;

FIG. 13 is an image showing a bottom view of plated leadframe terminals formed according to the example method shown in FIGS. 1-11B;

FIG. 14 is an image showing a side view of plated leadframe terminals formed according to the example method shown in FIGS. 1-11B.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides methods of forming surface-mounted IC packages, e.g., flat no-leads packages, with solder enhanced leadframe terminals, e.g., using a process including both a laser grooving and a saw step cut prior to a singulation cut.

FIGS. 1-11B show an example process for forming flat no-leads packages, in particular QFN packages, having leadframe terminals plated with solder-enhancing material, according to one example. A similar process may be used for forming other types of flat no-leads packages, e.g., dual-flat no-leads (DFN) packages, and micro lead frame (MLP) packages.

Figure 1:
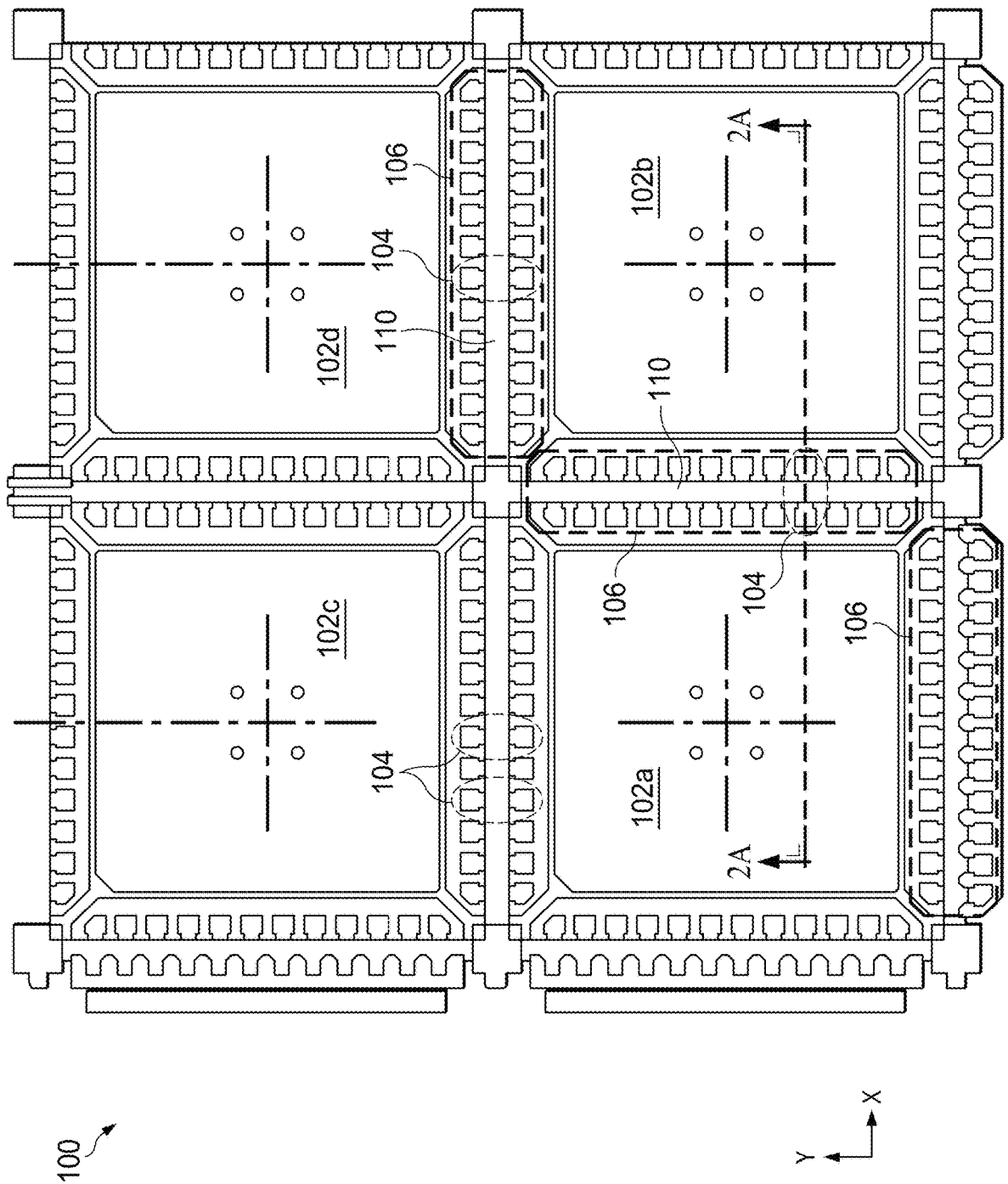

First, FIG. 1 is a top view of a portion of an example QFN leadframe 100 including a plurality of die attach pads 102a-102d and leadframe terminal structures 104 located around a perimeter of each die attach pad 102a-102d. As shown, each die attach pad 102a-104 may be surrounded on each side by a respective row 106 of leadframe terminal structures 104, such that a row 106 of leadframe terminal structures 104 is located between each adjacent pair of die attach pads 102a-102d. QFN leadframe 100 may be formed from copper or other suitable metal, and may be formed by performing a half etch on a leadframe blank or by any other suitable process.

FIG. 2A is a side cross-sectional view of a selected portion of the leadframe 100 taken through line 2A-2A shown in FIG. 1. As shown in the cross-sectional view, the selected portion of the leadframe 100 includes first die attach pad 102a, second die attach pad 102b, and a leadframe terminal structure 104 between the first die attach pad 102a and the second die attach pad 102b. The leadframe terminal structure 104 includes a first terminal portion 116a adjacent the first die attach pad 102a, a second terminal portion 116b adjacent the second die attach pad 102b, and a leadframe terminal groove 110 located between the first terminal portion 116a and the second terminal portion 116b. The first terminal portion 116a includes a bottom surface 118a, and the second terminal portion 116b includes a bottom surface 118b. The leadframe terminal groove 110 includes a bottom region 110a and sidewall regions 110b extending from opposing sides of the bottom region 110a.

FIG. 2B shows a three-dimensional view of the leadframe terminal structure 104, as indicated by arrow 2B-2B shown in FIG. 2A. The leadframe terminal structure 104 includes the leadframe terminal groove 110 located between the first terminal portion 116a (having bottom surface 118a) and second terminal portion 116b (having bottom surface 118b).

Next, as shown in the side cross-section view of FIG. 3, a first die (chip) 112a is mounted to the first die attach pad 102a and a second die (chip) 112b is mounted to the second die attach pad 102b, according to an assembly process. Dies 112a, 112b may be mounted to die attach pads 102a, 102b by solder ball attachment or other suitable mounting technique. The first die 112a may be connected to the first terminal portion 116a of the leadframe terminal structure 104 by a first wire bond connection 114a, and the second die 112b may be connected to the second terminal portion 116b of the leadframe terminal structure 104 by a second wire bond connection 114b.

Next, as shown in the side cross-section view of FIG. 4A, a die encapsulation process may be performed to encapsulate the mounted and wire bonded dies 112a, 112b in a mold compound 130. The mold compound 130 also partially or completely fills the leadframe terminal groove 110 formed in the leadframe terminal structure 104. The mold compound 130 may comprise a polymer, for example an epoxy molding compound (EMC) including a mixture of an epoxy resin, a filler (silica, silicon dioxide ($SiO_2$)), a hardener and other additives. In some examples, a post-molding cure may be performed to harden or set the mold compound 130. As shown, bottom leadframe surfaces, including bottom surface 118a of first terminal portion 116a and bottom surface 118b of second terminal portion 116b, may remain exposed, i.e., not encapsulated by the mold compound 130.

FIG. 4B shows a three-dimension view of the leadframe terminal structure 104 as indicated by arrow 2B-2B shown in FIG. 4A, i.e., after the die encapsulation process. As shown, the bottom surface 118a of first terminal portion 116a and bottom surface 118b of second terminal portion 116b remain exposed through the mold compound 130, while the leadframe terminal groove 110 is filled (fully or partially) with the mold compound 130.

Next, as shown in the side cross-section view of FIG. 5, the encapsulated structure may be turned over such that the exposed bottom side of the leadframe now faces upward, and a laser grooving process is performed on the leadframe terminal structure 104, as indicated by arrows L. In other examples the laser grooving and additional processes described herein may be performed from the bottom, without turning over the encapsulated structure. The laser grooving process may extend along the row 106 of leadframe terminal structures 104 including the leadframe terminal structure 104 shown in FIG. 5 (see FIG. 1 for reference), to remove a first amount of mold compound 130 from the leadframe terminal groove 110 in each leadframe terminal structure 104, without cutting into the leadframe terminal structure 104 itself. The first amount of mold compound 130 removed by the laser grooving process may include (a) all of the mold compound 130 in the leadframe terminal groove 110 or (b) only a partial portion of the mold compound 130 in the leadframe terminal groove 110, depending on various factors, e.g., the specific geometry of the leadframe terminal groove 110 and/or the specific process parameters of the laser grooving process. In one example the laser grooving process may extend along the entire row 106 of leadframe terminal structures 104, i.e. along an entire length thereof.

After the laser grooving process, a chemical deflash may be performed to remove a second amount of mold compound 130 from the leadframe terminal groove 110, in particular in situations in which an amount of mold compound 130 remains in the leadframe terminal groove 110 after the laser grooving process. The chemical deflash may involve immersing the leadframe structure in a chemical bath, for example at elevated temperature. The second amount of mold compound 130 removed by the chemical deflash may include (a) all of the mold compound 130 remaining in the leadframe terminal groove 110 after the laser grooving process or (b) only a partial portion of the mold compound 130 remaining in the leadframe terminal groove 110 after the laser grooving process, depending on various factors, e.g., the specific process parameters of the chemical deflash.

Figure 6:
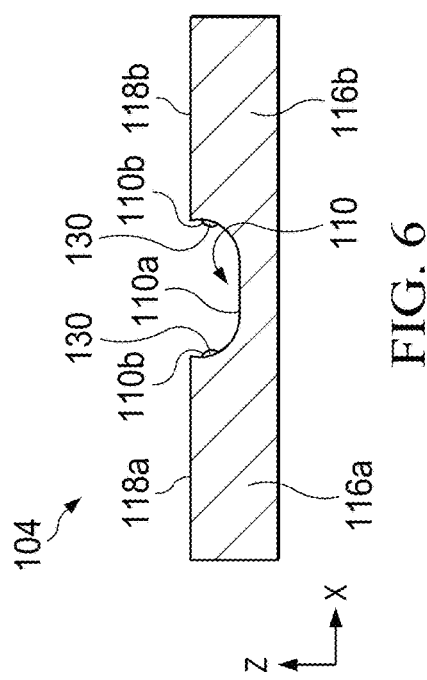

In some instances, an amount of the mold compound 130 may still remain in the leadframe terminal groove 110 after the laser grooving and chemical deflash. For example, FIG. 6 shows a side cross-section view of the leadframe terminal structure 104 after the laser grooving process and chemical deflash discussed above. In some instances, the laser grooving process and/or chemical deflash may remove all mold compound 130 from the bottom region 110a of the leadframe terminal groove 110 but not from the sidewall regions 110b. FIG. 6 shows example regions of mold compound 130 remaining on at least one of sidewall region 110b of the leadframe terminal groove 110 after the laser grooving and chemical deflash.

Figure 7:
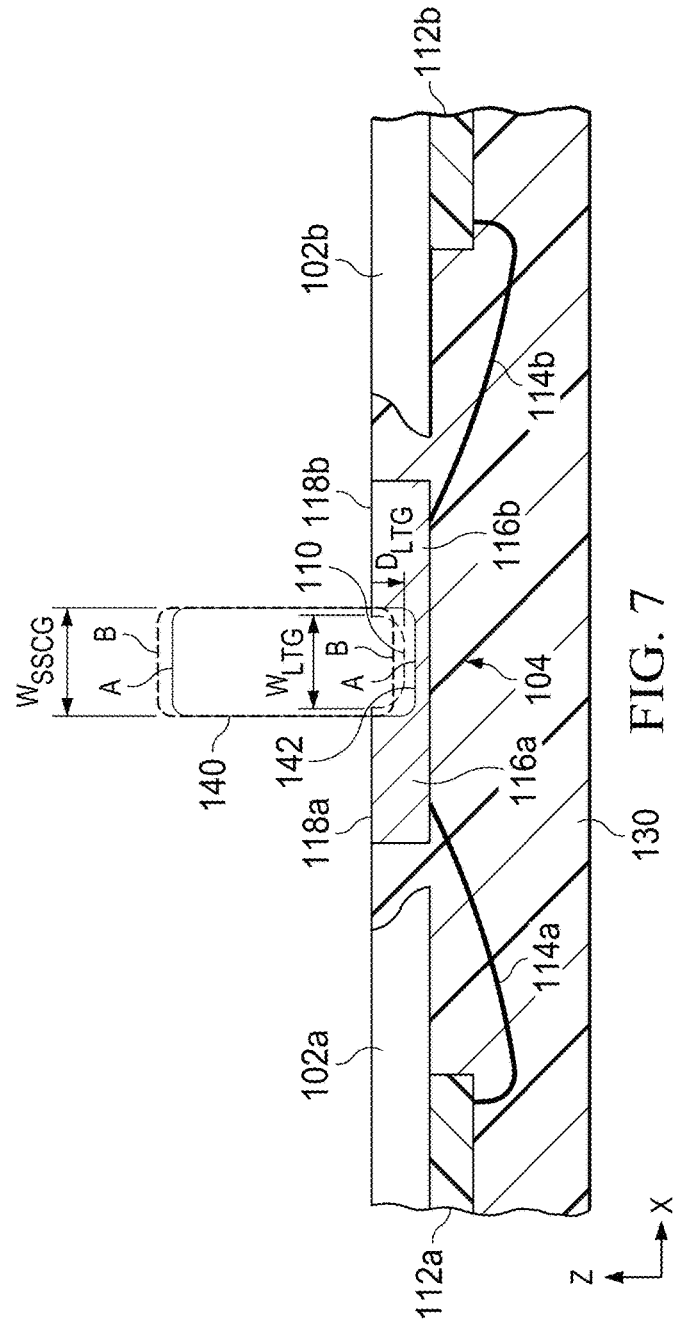

Next, as shown in the side cross-section view of FIG. 7, a mechanical saw step cut using a step cut saw blade 140 may be performed along the leadframe terminal groove 110 and extending through a partial vertical depth of the leadframe terminal structure 104 to define a saw step cut groove 142 in the leadframe terminal structure 104, which removes any remaining mold compound 130 from the leadframe terminal groove 110. The saw step cut groove 142 exhibits a lateral width $W_{SSCG}$ which may be greater than a lateral width $W_{LTG}$ of the leadframe terminal groove 110, which lateral width $W_{LTG}$ is defined at its maximum dimension, which leadframe terminal groove 110 exhibits a vertical depth $D_{LTG}$.

The vertical depth of the saw step cut groove 142 depends on the vertical positioning of the step cut saw blade 140, which may vary based on process variation or other factors. FIG. 7 shows two example vertical positionings of the step cut saw blade 140: (1) a first vertical positioning indicated by the solid outline of the step cut saw blade 140 labeled "A" and (b) a second vertical positioning indicated by the dashed outline of the step cut saw blade 140 labeled "B." As shown, (a) the vertical positioning "A" of the step cut saw blade 140 cuts deeper than the vertical depth $D_{LTG}$ of leadframe terminal groove 110, i.e. the saw step cut groove 142 formed by step cut saw blade 140 extends down to vertical depth vertical depth $D_{LTG}$ below bottom region 110a (see FIG. 6) of the leadframe terminal groove 110, while (b) the vertical positioning "B" of the step cut saw blade 140 cuts less deep than the vertical depth $D_{LTG}$ of leadframe terminal groove 110, such that the saw step cut groove 142 may be defined in part (e.g., at the laterally sidewall areas) by the step cut saw blade 140 and in part by the bottom region 110a (see FIG. 6) of the leadframe terminal groove 110.

FIG. 8A is a side cross-sectional view showing the saw step cut groove 142 formed by the mechanical saw step cut shown in FIG. 7, and FIG. 8B shows a three-dimensional view of the leadframe terminal structure 104 shown in FIG. 8A, as indicated by arrow 8B-8B shown in FIG. 8A. As shown, and as indicated above, the lateral width $W_{SSCG}$ of the saw step cut groove 142 formed by the step cut saw blade 140 may be greater than the lateral width $W_{LTG}$ of the leadframe terminal groove 110. The vertical depth, $D_{SSCG}$, of the saw step cut groove 142 formed by the step cut saw blade 140 depends on the vertical positioning of the step cut saw blade 140, which may vary as discussed above. The example saw step cut groove 142 shown in FIG. 8A corresponds with the vertical positioning "A" of the step cut saw blade 140. The vertical depth $D_{SSCG}$ of the example saw step cut groove 142 with vertical positioning "A" is deeper than the vertical depth $D_{LTG}$ of the leadframe terminal groove 110. As shown, the regions of mold compound 130 remaining on sidewall regions 110b of the leadframe terminal groove 110 after the laser grooving and chemical deflash (discussed above regarding FIG. 6) are completely contained within the saw step cut groove 142, i.e. within lateral width $W_{SSCG}$, such that the saw step cut may completely remove these remaining regions of mold compound 130 from the leadframe terminal groove 110.

In addition, it can also be seen that a saw step cut to a vertical depth $D_{SSCG}$ less than the vertical depth $D_{LTG}$ of the leadframe terminal groove 110, for example a saw step cut by the step cut saw blade 140 positioned at the vertical positioning "B," may also completely remove the remaining regions of mold compound 130 from the leadframe terminal groove 110, as the remaining regions of mold compound 130 are located fully within the extent of the saw step cut, i.e. within lateral width $W_{SSCG}$.

Performing the laser grooving process prior to the saw step cut as disclosed above may improve the results of the saw step cut. For example, the laser grooving process may remove a substantial amount of the mold compound 130 from the leadframe terminal groove 110 prior to the saw step cut, which may reduce the formation of metal burrs from the leadframe that can result from a mechanical saw cut through an area containing mold compound. For example, large forces imparted by the cutting blade may cause the silica filler or other hard component of the mold compound to deform the softer material (e.g., copper) of the leadframe, thereby causing burrs or other deformations of the leadframe metal. The formation of such burrs or leadframe deformations can thus be reduced by at least partially removing the mold compound from the leadframe terminal groove 110 prior to the saw step cut.

Next, as shown in FIG. 9A, exposed bottom surfaces of the leadframe 100 are plated with a solder-enhancing plating material 150, including an exposed bottom surface 146a of the first die attach pad 102a, an exposed bottom surface 146b of the second die attach pad 102b, the exposed bottom surface 118a of the first terminal portion 116a, the exposed bottom surface 118b of the second terminal portion 116b, and the exposed surfaces of the saw step cut groove 142. For example, the exposed bottom surfaces of the leadframe 100 may be electroplated with tin.

FIG. 9B shows a three-dimension view of the leadframe terminal structure 104 shown in FIG. 9A, as indicated by arrow 9B-9B shown in FIG. 9A, showing the solder-enhancing plating material 150 on the exposed bottom surfaces of the leadframe terminal structure 104 (including bottom surface 118a of first terminal portion 116a, bottom surface 118b of second terminal portion 116b, and the saw step cut groove 142—see FIG. 9A).

A singulation process may then be performed to define a plurality of discrete "singulated" IC packages, each including an encapsulated die, including a first IC package 170a including the first die 112a and a second IC package 170b including the second die 112b (see FIGS. 10, 11A and 11B discussed below). The singulation process may include multiple singulation cuts, including a singulation saw cut extending along each row 106 of leadframe terminal structures 104 adjacent each die attach pad 102a-102d (see FIG. 1 for reference).

FIG. 10 is a side cross-section view showing a singulation cut along the saw step cut groove 142 and extending through the full depth of the leadframe terminal structure 104. FIG. 11A is a side cross-sectional view showing the results of the singulation cut shown in FIG. 9, and FIG. 11B shows a three-dimension view of the leadframe terminal structure 104 shown in FIG. 11A, as indicated by arrow 11B-11B shown in FIG. 11A.

As shown in FIGS. 10, 11A, and 11B collectively, the singulation cut is performed using a singulation cut saw blade 160 aligned with the saw step cut groove 142 and extending through the full depth of the leadframe terminal structure 104 to divide the leadframe terminal structure 104 into (a) a first leadframe terminal 166a of the first IC package 170a and (b) a second leadframe terminal 166b of the second IC package 170b. The first leadframe terminal 166a includes a first terminal end surface 142a defined by a remaining portion of the saw step cut groove 142 on one side of the singulation cut, and the second leadframe terminal 166b includes a second terminal end surface 142b defined by a remaining portion of the saw step cut groove 142 on the other side of the singulation cut.

A lateral width $W_{SSC}$ of the singulation cut may be smaller than the lateral width $W_{SSCG}$ of the saw step cut groove 142, such that a first region of solder-enhancing plating material 150 remains on the first terminal end surface 142a of the first leadframe terminal 166a, and a second region of solder-enhancing plating material 150 remains on the second terminal end surface 142b of the second leadframe terminal 166b. In one example, the lateral width $W_{SSC}$ of the singulation cut is smaller than a lateral width $W_{SEPO}$ of an opening between of an opening between the solder-enhancing plating material 150 on the vertical sidewalls on opposing sides of the saw step cut groove 142, such that the singulation cut saw blade 160 does not cut through the solder-enhancing plating material 150 on the vertical sidewalls on opposing sides of the saw step cut groove 142.

As shown in FIGS. 11A and 11B, the singulation cut also exposes vertical end surfaces of the leadframe material (e.g., copper) below the saw step cut groove 142, in particular a first exposed (unplated) leadframe end surface 164a of the first leadframe terminal 166a and a second exposed (unplated) leadframe end surface 164b of the second leadframe terminal 166b.

FIG. 12 shows a side cross-sectional view of the first IC package 170a (formed by the process shown in FIG. 1-11B) mounted to a printed circuit board (PCB) 200, according to one example. As shown, the die attach pad 102a and each first leadframe terminal 166a may be soldered to a respective area on the PCB 200 using a solder material 204. The solder-enhancing plating material 150 on the first IC package 170a may provide enhanced solder connections with the PCB 200. In particular, the solder-enhancing plating material 150 on the first terminal end surface 142a of each first leadframe terminal 166a may provide an enhanced solder connection between each first leadframe terminal 166a and PCB 200.

FIG. 13 is an image showing a bottom view of three first leadframe terminals 166a formed according to the example method shown in FIGS. 1-11B. As shown, each first leadframe terminal 166a includes (a) the bottom surface 118a and first terminal end surface 142a plated with solder-enhancing plating material 150 and (b) the exposed (unplated) leadframe end surface 164a (e.g., exposed copper).

FIG. 14 is an image showing an end view of the three first leadframe terminals 166a shown in FIG. 13. The end view of each first leadframe terminal 166a shows (a) the first terminal end surface 142a plated with solder-enhancing plating material 150 and (b) the exposed (unplated) leadframe end surface 164a (e.g., exposed copper).

Figure 15:
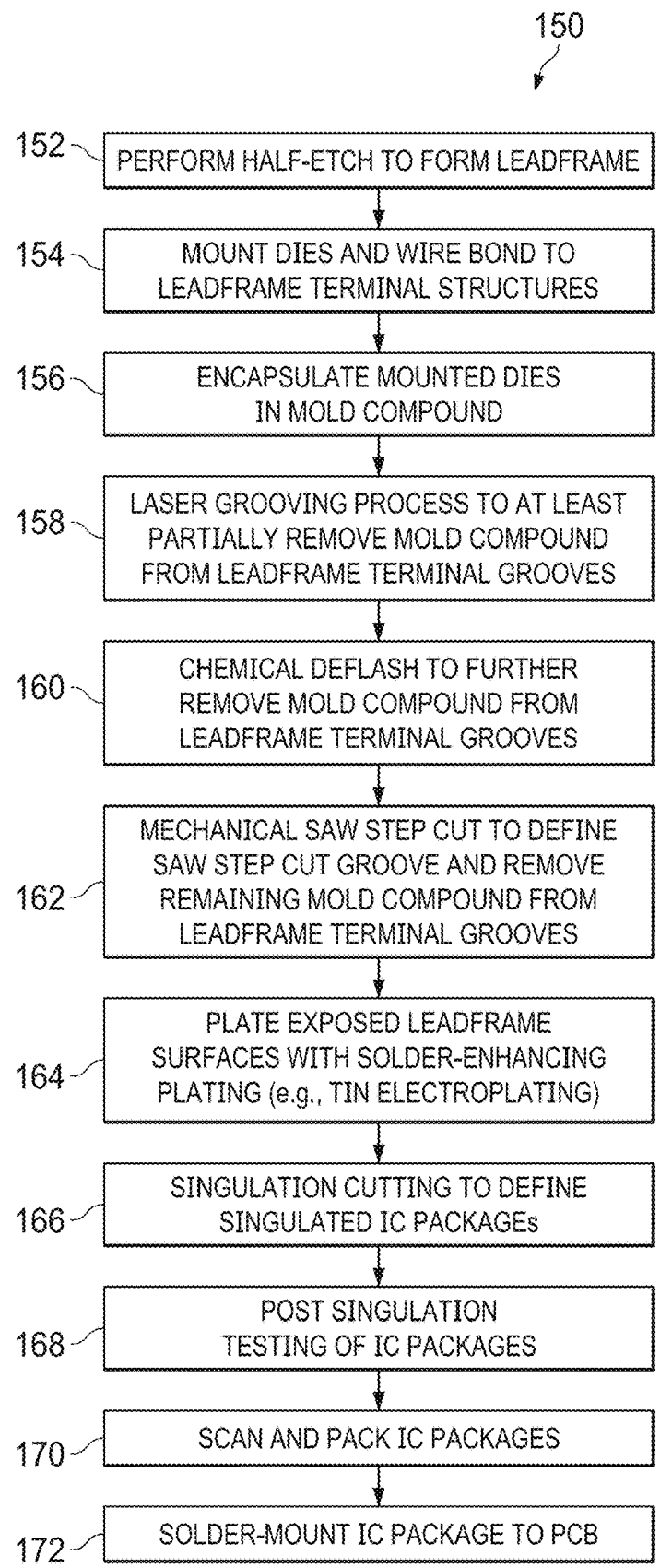
FIG. 15 is a flowchart showing an example process flow corresponding with the example process for forming flat no-leads packages as shown in FIGS. 1-11B and mounting an example package to a PCB as shown in FIG. 12.

FIG. 15 is a flowchart showing an example process flow 1500 corresponding with the example process for forming flat no-leads packages as shown in FIGS. 1-11B and mounting an example package to a PCB as shown in FIG. 12. At 1502, a flat no-leads leadframe (e.g., DNF or QFN leadframe) is formed by performing a half etch on a leadframe blank, e.g., comprising copper or other suitable metal, e.g., as shown in FIG. 1 and discussed above. The leadframe may include a plurality of die attach pads, with a row of leadframe terminal structures between each adjacent pair of die attach pads, as discussed above regarding FIG. 1. A leadframe terminal groove extends along each row of leadframe terminal structures, wherein for each leadframe terminal structure, the leadframe terminal groove defines a pair of terminal portions on opposing sides of the leadframe terminal groove. The leadframe terminal groove includes a bottom region and sidewall regions extending from opposing sides of the bottom region.

At 154, a respective die (chip) is mounted to each die attach pad of the leadframe, e.g., by solder ball attachment or other suitable mounting technique, and each die may be wire bonded to a plurality of leadframe terminal structures, e.g., as discussed above with reference to FIG. 3.

At 156, a die encapsulation process may be performed to encapsulate the mounted and wire bonded dies in a mold compound, e.g., as discussed above with reference to FIGS. 4A-4B. As noted above, the mold compound may comprise a polymer, for example an epoxy molding compound (EMC) including a mixture of an epoxy resin, a filler (silica, silicon dioxide ($SiO_2$)), a hardener and other additives. The mold compound may partially or completely fill each leadframe terminal groove on the leadframe.

At 158, a laser grooving process may be performed to remove mold compound from the leadframe terminal groove in each leadframe terminal structure, e.g., as discussed above with reference to FIG. 5. The laser grooving process may remove some or all of the mold compound from each leadframe terminal groove, depending on various factors, for example the composition of the mold compound, process parameters of the laser grooving process, and the shape of each leadframe terminal groove.

At 160, a chemical deflash may be performed to further remove mold compound from each leadframe terminal groove, where the laser grooving process fails to remove all mold compound from the respective leadframe terminal groove. The chemical deflash may involve immersing the leadframe structure in a chemical bath, for example at elevated temperature, as discussed above. However, in some instances regions of mold compound may remain in at least some leadframe terminal grooves after the laser grooving process and chemical deflash, e.g., as shown in FIG. 6 discussed above.

At 162, a mechanical saw step cut may be performed using along each leadframe terminal groove, e.g., as discussed above regarding FIGS. 7A-7B and 8A-8B. The saw step cut along each leadframe terminal groove may define a saw step cut groove, e.g., having a greater lateral width than a lateral width of the respective leadframe terminal groove (and in some instances a greater depth), which may remove any remaining mold compound from each leadframe terminal groove.

As discussed above, performing the laser grooving prior to the saw step cut as disclosed above may improve the results of the saw step cut, for example by reducing the formation of leadframe burrs resulting from the saw step cut, e.g., where mold compound existing in the leadframe terminal groove during the saw step cut may promote the formation of leadframe burrs.

At 164, exposed surfaces of the leadframe, including exposed surfaces of each leadframe terminal structure (including exposed surfaces of the saw step cut groove), may be plated with a solder-enhancing plating material (e.g., tin), for example as shown in FIGS. 9A-9B discussed above. In one example, the plating is performed by an electroplating process.

At 166, a singulation process may define a plurality of singulated IC packages, each including an encapsulated die. The singulation process may include multiple singulation saw cuts, including a singulation saw cut extending through each saw step cut groove along each row of leadframe terminal structures. As discussed above regarding FIGS. 10 and 11A-11B, the singulation cut through each leadframe terminal structure defines a pair of separated leadframe terminals, each wire bonded to a respective die. At 168, a post singulation test may be performed to test each singulated IC package. Each IC package may be scanned and packaged at 170.

At 172 each IC package may be solder-mounted to a PCB. For example, the die attach pad and the multiple leadframe terminals of each IC package may be soldered to respective areas on the PCB, e.g., as shown in FIG. 12 discussed above. The solder-enhancing plating material (e.g., tin) on the IC package surfaces, including on the surfaces of the leadframe terminals, may provide an enhanced solder connection between with the PCB.

The invention claimed is:

1. A method of forming an electronic device, the method comprising:
forming or accessing an encapsulated integrated circuit (IC) structure including a first die mounted on a first die attach pad of a leadframe, a second die mounted on a second die attach pad of the leadframe, a row of leadframe terminal structures of the leadframe between the first and second die attach pads, a leadframe terminal groove extending along the row of leadframe terminal structures, the leadframe terminal groove extending partially through a thickness of the row of leadframe terminal structures to define a reduced-thickness portion of the leadframe, and a mold compound encapsulating the first and second dies and at least partially filling the leadframe terminal groove;
after forming or accessing the encapsulated IC structure including the row of leadframe terminal structures and the leadframe terminal groove, performing a laser grooving process to remove a first amount of the mold compound from the leadframe terminal groove, wherein a remaining region of the mold compound remains in the leadframe terminal groove after the laser grooving process;
performing a saw step cut along the leadframe terminal groove extending through a partial depth of respective ones of the row of leadframe terminal structures to define a saw step cut groove, the saw step cut groove having a lateral width larger than a lateral width of the leadframe terminal groove, the saw step cut removing the remaining region of mold compound from the leadframe terminal groove;
performing a plating process to plate exposed surfaces of respective ones of the row of leadframe terminal structures, including exposed surfaces of the saw step cut groove, with a solder-enhancing plating material; and
performing a singulation process to define a first IC package including the first die and a second IC package including the second die, the singulation process including a singulation cut extending along the row of leadframe terminal structures and aligned with the saw step cut groove, the singulation cut dividing respective ones of the row of leadframe terminal structures into (a) a first leadframe terminal of the first IC package, the first leadframe terminal having a first terminal end surface and (b) a second leadframe terminal of the second IC package, the second leadframe terminal having a second terminal end surface;
wherein the singulation cut has a lateral width smaller than the lateral width of the saw step cut groove such that a region of solder-enhancing plating material remains on the first terminal end surface and second terminal end surface defined by the singulation cut.

2. The method of claim 1, comprising, after the singulation process, mounting the first IC package to a printed circuit board (PCB), including soldering the first leadframe terminal to the PCB, wherein the region of solder-enhancing plating material on the respective first leadframe terminal provides an enhanced solder connection between the first IC package and the PCB.

3. The method of claim 1, comprising, after the laser grooving process and before the saw step cut, performing a deflash process to chemically remove a second amount of the mold compound remaining in the leadframe terminal groove after the laser grooving process.

4. The method of claim 1, wherein:
the leadframe terminal groove has a bottom region and sidewall regions extending from opposing sides of the bottom region;
the remaining region of the mold compound remains on at least one of the sidewall regions of the leadframe terminal groove after the laser grooving process; and
the saw step cut removes the remaining region of mold compound from the sidewall surface of the leadframe terminal groove.

5. The method of claim 1, wherein the saw step cut extends down to a vertical depth below the leadframe terminal groove.

6. The method of claim 1, wherein the saw step cut extends down to a depth above a bottom of the leadframe terminal groove.

7. The method of claim 1, wherein the solder-enhancing plating material comprises tin.

8. The method of claim 1, wherein the plating process comprise an electroplating process.

9. The method of claim 1, wherein the first IC package comprises a flat no-leads package.

10. The method of claim 1, wherein the first IC package comprises a quad-flat no-leads package.

11. The method of claim 1, wherein the first IC package comprises a dual-flat no-leads package.

12. The method of claim 1, wherein the first IC package comprises a micro lead frame package.

13. A method of forming an electronic device, the method comprising:
mounting a first die to a first die attach pad of a leadframe;
mounting a second die to a second die attach pad of the leadframe;
bonding the first and second dies to a row of leadframe terminal structures of the leadframe between the first and second die attach pads;
encapsulating the first and second bonded dies with a mold compound, wherein the mold compound at least partially fills a leadframe terminal groove extending along the row of leadframe terminal structures between the first and second die attach pads, the leadframe terminal groove extending partially through a thickness of the row of leadframe terminal structures to define a reduced-thickness portion of the leadframe;
after encapsulating the first and second bonded dies with the mold compound, wherein the mold compound at least partially fills the leadframe terminal groove, performing a laser grooving process along the leadframe terminal groove to remove a first amount of the mold compound from the leadframe terminal groove, wherein a remaining region of the mold compound remains in the leadframe terminal groove after the laser grooving process;

performing a saw step cut along the leadframe terminal groove and extending through a partial depth of respective ones of the row of leadframe terminal structures to define a saw step cut groove, the saw step cut groove having a lateral width larger than a lateral width of the leadframe terminal groove, the saw step cut removing the remaining region of mold compound from the leadframe terminal groove;

performing a plating process to plate exposed surfaces of respective ones of the row of leadframe terminal structures including exposed surfaces of the saw step cut groove, with a solder-enhancing plating material; and performing a singulation process to define a first integrated circuit (IC) package including the first die and a second IC package including the second die, the singulation process including a singulation cut extending along the row of leadframe terminal structures and aligned with the saw step cut groove, the singulation cut dividing respective ones of the row of leadframe terminal structures into (a) a first leadframe terminal of the first IC package, the first leadframe terminal having a first terminal end surface and (b) a second leadframe terminal of the second IC package, the second leadframe terminal having a second terminal end surface;

wherein the singulation cut has a lateral width smaller than the lateral width of the saw step cut groove such that a region of solder-enhancing plating material remains on the first terminal end surface and second terminal end surface defined by the singulation cut.

14. The method of claim 13, comprising, after the singulation process, mounting the first IC package to a printed circuit board (PCB), including soldering the first leadframe terminal to the PCB, wherein the region of solder-enhancing plating material on the respective first leadframe terminal provides an enhanced solder connection between the first IC package and the PCB.

15. The method of claim 13, comprising, after the laser grooving process and before the saw step cut, performing a deflash process to chemically remove a second amount of the mold compound remaining in the leadframe terminal groove after the laser grooving process.

16. The method of claim 13, comprising, prior to mounting the first die to the first die attach pad and mounting the second die to the second die attach pad, half etching a leadframe blank to form the leadframe including the first and second die attach pads and the row of leadframe terminal structures.

17. The method of claim 13, wherein:
the leadframe terminal groove has a bottom region and sidewall regions extending from opposing sides of the bottom region;
a remaining region of the mold compound remains on at least one of the sidewall regions of the leadframe terminal groove after the laser grooving process; and
the saw step cut removes the remaining region of mold compound from the sidewall surface of the leadframe terminal groove.

18. The method of claim 13, wherein the saw step cut extends down to a vertical depth below a bottom of the leadframe terminal groove.

19. The method of claim 13, wherein the saw step cut extends down to a depth above a bottom of the leadframe terminal groove.

20. A method of forming an electronic device, the method comprising:
forming or accessing an encapsulated integrated circuit (IC) structure including a first die mounted on a first die attach pad of a leadframe, a second die mounted on a second die attach pad of the leadframe, a row of leadframe terminal structures of the leadframe between the first and second die attach pads, a leadframe terminal groove extending along the row of leadframe terminal structures, the leadframe terminal groove extending partially through a thickness of the row of leadframe terminal structures to define a reduced-thickness portion of the leadframe, and a mold compound encapsulating the first and second dies and at least partially filling the leadframe terminal groove;

after forming or accessing the encapsulated IC structure including the row of leadframe terminal structures and the leadframe terminal groove, performing a laser grooving process to remove a first amount of the mold compound from the leadframe terminal groove;

performing a saw step cut along the leadframe terminal groove, the saw step cut having a vertical depth extending through a partial depth of respective ones of the row of leadframe terminal structures to define a saw step cut groove, the vertical depth of the saw step cut located above a bottom of the leadframe terminal groove, and the saw step cut groove having a lateral width larger than a lateral width of the leadframe terminal groove, performing a plating process to plate exposed surfaces of respective ones of the row of leadframe terminal structures, including exposed surfaces of the saw step cut groove, with a solder-enhancing plating material; and performing a singulation process to define a first IC package including the first die and a second IC package including the second die, the singulation process including a singulation cut extending along the row of leadframe terminal structures and aligned with the saw step cut groove, the singulation cut dividing respective ones of the row of leadframe terminal structures into (a) a first leadframe terminal of the first IC package, the first leadframe terminal having a first terminal end surface and (b) a second leadframe terminal of the second IC package, the second leadframe terminal having a second terminal end surface;

wherein the singulation cut has a lateral width smaller than the lateral width of the saw step cut groove such that a region of solder-enhancing plating material remains on the first terminal end surface and second terminal end surface defined by the singulation cut.

21. The method of claim 20, wherein:
after the laser grooving process, a remaining region of the mold compound remains on at least one sidewall region of the leadframe terminal groove; and
the saw step cut removes the remaining region of mold compound from the sidewall surface of the leadframe terminal groove.

* * * * *